(12) United States Patent
Chan et al.

(10) Patent No.: US 8,962,477 B2
(45) Date of Patent: Feb. 24, 2015

(54) HIGH TEMPERATURE ANNEAL FOR STRESS MODULATION

(75) Inventors: Meng-Hsuan Chan, Taipei (TW); Wei-Yang Lee, Taipei (TW); Da-Yuan Lee, Jhubei (TW); Kuang-Yuan Hsu, Fongyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 146 days.

(21) Appl. No.: 13/208,435

(22) Filed: Aug. 12, 2011

(65) Prior Publication Data

US 2013/0040455 A1 Feb. 14, 2013

(51) Int. Cl.
| | | |
|---|---|---|
| H01L 21/44 | (2006.01) | |
| H01L 21/28 | (2006.01) | |
| H01L 29/49 | (2006.01) | |
| H01L 29/66 | (2006.01) | |
| H01L 29/78 | (2006.01) | |

(52) U.S. Cl.
CPC ...... *H01L 21/28088* (2013.01); *H01L 29/4966* (2013.01); *H01L 29/66545* (2013.01); *H01L 29/7845* (2013.01); *H01L 29/78* (2013.01)
USPC ............................ 438/653; 438/660; 438/663

(58) Field of Classification Search
CPC ............. H01L 2224/1308; H01L 2224/13111; H01L 21/76843; H01L 21/76846
USPC .......... 438/653, 660, 663; 257/280, 281, 284, 257/510, 328
See application file for complete search history.

(56) References Cited

U.S. PATENT DOCUMENTS

| | | | | |
|---|---|---|---|---|
| 6,858,524 | B2 * | 2/2005 | Haukka et al. | 438/585 |
| 7,834,399 | B2 * | 11/2010 | Kanarsky et al. | 257/351 |
| 2002/0011613 | A1 * | 1/2002 | Yagishita et al. | 257/284 |
| 2005/0051854 | A1 * | 3/2005 | Cabral et al. | 257/407 |
| 2011/0291163 | A1 * | 12/2011 | Kronholz et al. | 257/288 |
| 2012/0223397 | A1 * | 9/2012 | Yang et al. | 257/411 |

* cited by examiner

*Primary Examiner* — Zandra Smith
*Assistant Examiner* — John M Parker
(74) *Attorney, Agent, or Firm* — Duane Morris LLP

(57) ABSTRACT

A method for modulating stress in films formed in semiconductor device manufacturing provides for high temperature annealing of an as-deposited compressive film such as titanium nitride. The high temperature annealing converts the initially compressive film to a tensile film without compromising other film qualities and characteristics. The converted tensile films are particularly advantageous as work function adjusting films in PMOS transistor devices and are advantageously used in conjunction with additional metal gate materials.

14 Claims, 2 Drawing Sheets

HIGH TEMPERATURE ANNEAL FOR STRESS MODULATION

TECHNICAL FIELD

The disclosure relates, most generally, to semiconductor devices and methods for manufacturing the same, and more particularly to methods for annealing deposited films to modulate film stress.

BACKGROUND

In today's rapidly advancing field of semiconductor device manufacturing and technology, smaller and faster transistors are being produced enabling the evolution of semiconductor devices that are more complicated and more highly integrated. CMOS, complementary metal oxide semiconductor, semiconductor devices and other semiconductor devices include both NMOS (n-type metal oxide semiconductor) and PMOS (p-type metal oxide semiconductor) gate structures. The NMOS and PMOS gate structures operate most efficiently under different operating conditions and each benefits from being formed of dedicated materials particularly suited to the device requirements of the respective NMOS or PMOS transistor. NMOS and PMOS transistors are desirably formed of gate electrode materials that have different work functions so that the respective transistors may perform at the highest operational efficiencies. Since the NMOS and PMOS transistors are formed in and on the same semiconductor substrate, it is critical to form the NMOS and PMOS transistors using materials formed over the semiconductor substrate that have the appropriate material characteristics. One such characteristic is the stress of the material, i.e. compressive or tensile. Both the NMOS and PMOS transistors work most efficiently with a gate structure formed of a particular film or films having particular stress characteristics which are associated with particular work functions.

The processing operations used to deposit films such as may be used for transistor gate electrodes, have inherent characteristics as do the films formed using the deposition processes. While it may be possible to tune the deposition process itself by varying process parameters such as power, gas constituents, gas flow rates, temperatures and pressures, and while the process tuning efforts may advantageously alter some film characteristics such as changing an inherently compressive stress to be a tensile stress as deposited, such process tuning typically brings about undesirable film characteristics such as poor uniformity across the semiconductor substrate, poor step coverage of the deposited film and other undesirable film qualities.

It would therefore be desirable to tune the transistors and semiconductor devices by providing transistor gates formed of materials with desired material characteristics such as stress, without causing other undesirable aspects.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Disclosed is a process for modulating the stress of a deposited film such as a titanium nitride, TiN, or other deposited films. The film may be used to form a transistor gate or part of a transistor gate, most advantageously in a pFET (p-channel Field Effect Transistor). The film is a compressive film as deposited and a high temperature annealing process is used to convert the film from a compressive film to a tensile film, after deposition.

Figure 1:
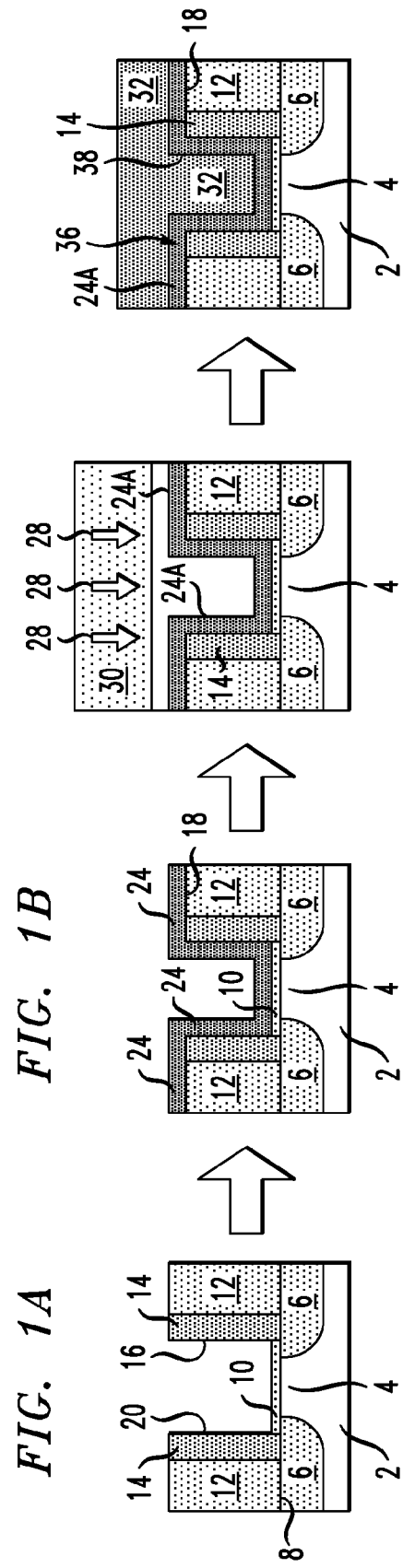
FIGS. 1A-1D are cross-sectional views illustrating an exemplary sequence of processing operations according to an aspect of the disclosure.

FIG. 1A is a cross-sectional view showing an exemplary transistor substructure and shows transistor channel 4 formed in substrate layer 2. Substrate layer 2 may be a silicon or other semiconductor material or other materials suitably used as substrates in the semiconductor manufacturing industry. In other exemplary embodiments, substrate layer 2 may be a layer formed over a semiconductor or other substrate used in the semiconductor manufacturing industry. Transistor channel 4 is defined in semiconductor substrate layer 2 as being between the source/drain regions 6 and beneath gate dielectric 10. Source/drain regions 6 may be P-type materials according to an exemplary embodiment in which the transistor is a pFET, i.e. a PMOS device. Gate dielectric 10 may be formed using conventional means and may include suitable thicknesses. Various gate dielectric materials may be used. In one exemplary embodiment, a silicon oxide film may be used and in another exemplary embodiment, a high-k gate dielectric material may be used. Various suitable materials are available and may be used as the high-k gate dielectric material. Dielectric 12 is formed over substrate surface 8. Sidewall spacers 14 are present and opening 16 is formed in dielectric 12 and between sidewall spacers 14. Dielectric 12 may be any of various suitable ILD, interlevel dielectric, or IMD, intermetal dielectric, materials as known in the art. Dielectric 12 may comprise one or more separately formed dielectric layers. Sidewall spacers 14 may be formed of silicon nitride or other suitable spacer materials. Opening 16 extends down to gate dielectric 10 and is bounded laterally by sidewalls 20 of sidewall spacers 14.

According to one exemplary embodiment, the structure shown in FIG. 1A may be formed using a process that utilizes the formation of dummy gates. One exemplary process involves the formation of a polysilicon or other gate material over gate dielectric 10 before dielectric 12 and sidewall spacers 14 are present. With the dummy gate in place, the source and drain regions 6 may be formed and then sidewall spacers 14 and dielectric 12 may be formed alongside the dummy gate. The structure may be planarized then the dummy gate selectively removed from gate regions to produce the structure such as shown in FIG. 1A. Other methods may be used to form the structure shown in FIG. 1A in other exemplary embodiments.

FIG. 1B shows the structure of FIG. 1A after film 24 has been deposited. Film 24 is formed over top surface 18 and within opening 16 along sidewalls 20 and over gate dielectric 10. According to one exemplary embodiment, film 24 may be formed using atomic layer deposition, ALD, and according to another exemplary embodiment, film 24 may be formed using PVD, physical vapor deposition. Other film deposition methods may be used in other exemplary embodiments. Film 24 may be TiN, titanium nitride, in one exemplary embodiment and in other exemplary embodiments, film 24 may be other suitable P-metals, i.e. metals suitable for use in metal gates of p-type devices. According to other exemplary embodiments, film 24 may be TaN, WN, TiAl or TiAlN. Film 24 may include a thickness of about 10 angstroms to about 100 angstroms in various exemplary embodiments but other thicknesses may be used in still other exemplary embodiment. Film 24 may be a work function tuning layer used between gate dielectric 10 and a metal gate formed over film 24, which may combine to produce a suitably low $V_t$. Upon deposition, film 24 is compressive in nature particularly when formed using PVD. Upon deposition, film 24 may include a compressive stress that varies from about −1 GPa to about −2 GPa but various other compressive stress values may be produced upon formation depending on parameters and conditions of the PVD process or other deposition process used to form film 24. For PMOS devices, particularly pFETs, compressive stress adversely effects $I_{on}$-$I_{off}$ performance as well as other performance and operational characteristics of the pFET.

After film 24 is formed as shown in FIG. 1B, a high temperature annealing process is used to convert film stress from compressive to tensile, as will be shown in FIG. 1C.

According to various exemplary embodiments, when film 24 is formed over the pFET structure shown in FIGS. 1A and 1B, it is formed using a deposition process that forms the film over an entire substrate and over other semiconductor devices including nFET devices as well. According to this exemplary embodiment, various suitable patterning operations and etching operations may be used to remove film 24 from unwanted areas such as from over nFET devices and other selected semiconductor devices and structures in which a tensile film is not desired.

FIG. 1C includes arrows 28 which signify the application of heat to the structure via a high-temperature annealing operation. The annealing operation may take place in ambient 30. Ambient 30 represents the environment and may be nitrogen, argon, or other suitable noble or other gases that are chosen to be non-reactive toward the exposed materials. The high-temperature annealing operation changes film 24 which is compressive as-deposited, to tensile film 24A. The other film characteristics are not compromised during the thermal annealing operation, i.e. other desirable film properties are unchanged. The annealing may include an annealing temperature ranging from about 600° C.-800° C. in one exemplary embodiment but other annealing temperatures within the range of 400° C.-1200° C. may be used in other exemplary embodiments. According to two advantageous embodiments, the annealing temperature may be 10 seconds or 30 seconds but according to other exemplary embodiments, a 4 second annealing time may be used. In various other exemplary embodiments, the annealing may be carried out for a time up to about 1000 seconds and at various temperatures. RTA, rapid thermal annealing, may be used in one exemplary embodiment but other annealing methods may be used in other exemplary embodiments. In other exemplary embodiments, other annealing methods may be used such as an MSA (millisecond anneal) method using a laser power source for a time ranging from about 100 microseconds to 999 microseconds or a USSA (microsecond anneal) method using a lamp as a power source and carried out for a time ranging from about 1 to 99 microseconds. According to the MSA or USSA embodiments, the anneal operation may be cycled or otherwise repeated several times for various time periods and various maximum temperatures.

According to one exemplary trial, film 24 was a TiN film, formed to a thickness between 10 and 100 angstroms, and the as-deposited compressive film stress was about '4 GPa. In this exemplary trial, a 600° C. anneal with anneal times ranging from 10 to 30 seconds, was effective in neutralizing the stress, i.e. producing a stress level of about 0 GPa. In another exemplary trial in which the as-deposited TiN film had a compressive stress of about −4 GPa and a thickness between 10 and 100 angstroms, an 800° C. annealing process for times ranging from 4-30 seconds, was effective in converting the film stress of the samples, to a tensile film having a tensile stress ranging from about 1-1.6 GPa. In all trials, it was found that interfacial layer regrowth was minimal and any WF, work function, drift was negligible.

Returning to FIG. 1C, tensile film 24A is formed as a result of the annealing process.

FIG. 1D shows the structure of FIG. 1C after conductive film 32 has been formed on tensile film 24A after the annealing operation. Conductive film 32 is formed over surface 36 and within former opening 38. Conductive film 32 may be aluminum, copper, or combinations or alloys thereof and in other exemplary embodiments conductive film 32 may be another suitable metal or other conductive material. Conductive film 32 is chosen in conjunction with tensile film 24A to produce a gate structure with a suitable work function such as desirable for a pFET metal gate.

Conductive film 32 and tensile film 24A may advantageously be removed from over top surface 18 to form a suitable pFET. The structure of FIG. 1D including the pFET then undergoes further processing operations and is integrated and interconnected to form various integrated circuits or other semiconductor devices.

Figure 2:
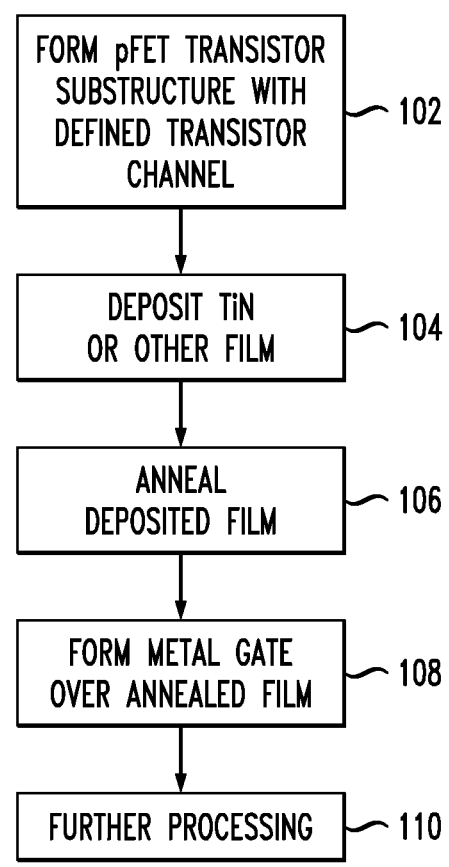
FIG. 2 is a process flow of an exemplary method of the disclosure.

FIG. 2 is a flowchart showing an exemplary method according to the disclosure. The method represented in FIG. 2 has been described in detail supra, in conjunction with FIGS. 1A-1D. Step 102 is a step for forming a pFET transistor substructure with a defined transistor channel. At step 104, titanium nitride or another suitable film is deposited and is compressive as deposited. At step 106, the deposited film is annealed and converted from a compressive film to a tensile film. At step 108, a metal gate material is formed over the annealed film and at step 110 further processing operations are carried out to complete the pFET transistor and integrate the transistor with other structures and components to form a completed integrated circuit or other semiconductor device.

According to one aspect, a method for forming a semiconductor transistor structure is provided. The method comprises providing a transistor substructure including a defined transistor channel in a semiconductor substrate, depositing TiN over the transistor channel using PVD, physical vapor deposition, annealing the TiN, and forming a metal gate over the TiN.

According to another aspect, another method for forming a semiconductor transistor structure is provided. The method comprises: providing a transistor substructure including a defined transistor channel in a semiconductor substrate; forming a compressive p-metal film over the defined transistor channel; annealing to convert the compressive p-metal film to a tensile p-metal film; and forming a metal gate over the tensile p-metal film.

According to another aspect, a method for forming a semiconductor transistor device is provided. The method comprises providing a transistor substructure including a defined transistor channel in a semiconductor substrate, the channel disposed between p-type source and drain regions and forming a compressive TiN film over the transistor channel using physical vapor deposition, PVD. The method further comprises annealing the compressive TiN film at a temperature between about 600° C. to about 800° C. thereby converting the compressive TiN film to a tensile film, and forming a metal gate over the TiN film.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for forming a semiconductor transistor device, said method comprising:
   providing a transistor substructure including a defined transistor channel in a semiconductor substrate;
   depositing TiN over said transistor channel;
   annealing said TiN; and
   after said annealing, forming a metal gate over said TiN by depositing a conductive material in an opening over said transistor channel, said metal gate consisting of said conductive material,
   wherein said transistor substructure comprises a p-type transistor substructure and said depositing TiN comprises depositing TiN over said p-type transistor and over n-type transistors and removing said TiN from over said n-type transistors prior to said annealing.

2. The method as in claim 1, wherein said depositing TiN comprises forming a compressive TiN film, and said annealing converts said compressive TiN film to a tensile TiN film.

3. The method as in claim 1, wherein said depositing TiN comprises PVD, physical vapor deposition.

4. The method as in claim 3, wherein said depositing TiN comprises forming a compressive TiN film and said annealing converts said compressive TiN film to a tensile TiN film.

5. The method as in claim 3, wherein said providing a transistor substructure includes providing a dummy polysilicon gate over said transistor channel and in an initial opening formed in a dielectric layer formed over said semiconductor substrate, and removing said dummy polysilicon gate prior to said depositing TiN.

6. The method as in claim 5, wherein said dummy polysilicon gate and said dielectric layer have coplanar top surfaces, and wherein said removing said dummy polysilicon gate forms said opening over said transistor channel and said depositing TiN forms a TiN liner on said bottom and sides of said opening.

7. The method as in claim 6, wherein said forming a metal gate comprises forming said conductive material over said TiN liner and filling said opening and further comprising removing said conductive material and said TiN from over said coplanar top surfaces by polishing thereby producing said metal gate having said conductive material as a top surface thereof.

8. The method as in claim 1, wherein said depositing TiN comprises depositing a TiN film with a thickness of about 10-100 angstroms, and wherein said forming a metal gate comprises said conductive material being an aluminum film.

9. The method as in claim 1, wherein said providing a transistor substructure comprises forming a dielectric over said semiconductor substrate and said opening is an opening in said dielectric.

10. The method as in claim 1, wherein said annealing comprises rapid thermal annealing and takes place for a time ranging from about 4 seconds to about 30 seconds.

11. A method for forming a semiconductor transistor structure, said method comprising:
    providing a transistor substructure including a defined transistor channel in a semiconductor substrate;
    forming a compressive p-metal film over said defined transistor channel;
    annealing to convert said compressive p-metal film to a tensile p-metal film; and
    after said annealing, forming a metal gate over said tensile p-metal film by depositing a conductive material in an opening over said transistor channel, said metal gate consisting of said conductive material and disposed over said tensile p-metal film
    wherein said defined transistor channel is a channel for a p-type transistor, said providing a transistor substructure further includes providing a defined n-type transistor channel in said semiconductor substrate, said forming a compressive p-metal film further comprises forming said compressive p-metal film over said defined n-type transistor channel and further comprising removing said p-metal film from over said n-type transistor channel prior to said annealing.

12. The method as in claim 11, wherein said annealing comprises rapid thermal annealing, and said annealing takes place for about 4 seconds to about 30 seconds.

13. The method as in claim 11, wherein
    said providing a transistor substructure includes providing a dummy polysilicon gate over said transistor channel and in an initial opening formed in a dielectric layer formed over said semiconductor substrate, said dummy polysilicon gate and said dielectric layer having coplanar top surfaces, and removing said dummy polysilicon gate, thereby forming a trench over said transistor channel, wherein said depositing TiN forms a TiN liner on bottom and sides of said trench thereby forming said opening, and wherein said forming a metal gate comprises forming said conductive material over said TiN liner and filling said opening and further comprising removing said metal material and said TiN from over said planar top surface by polishing.

14. The method as in claim 11, wherein said compressive p-metal film comprises TiN and said forming a compressive p-metal film comprises physical vapor deposition.

* * * * *